United States Patent
Clarke

(10) Patent No.: US 9,954,502 B2
(45) Date of Patent: Apr. 24, 2018

(54) ISOLATION IN A MULTI-PORT AMPLIFIER

(71) Applicant: Airbus Defence and Space Limited, Hertfordshire (GB)

(72) Inventor: Owen William Clarke, Hertfordshire (GB)

(73) Assignee: Airbus Defence and Space Limited, Hertfordshire (GB)

( * ) Notice: Subject to any disclaimer, the term of this patent is extended or adjusted under 35 U.S.C. 154(b) by 0 days.

(21) Appl. No.: 15/127,547

(22) PCT Filed: Mar. 17, 2015

(86) PCT No.: PCT/GB2015/050773
§ 371 (c)(1),
(2) Date: Sep. 20, 2016

(87) PCT Pub. No.: WO2015/140533
PCT Pub. Date: Sep. 24, 2015

(65) Prior Publication Data
US 2017/0149396 A1    May 25, 2017

(30) Foreign Application Priority Data

Mar. 20, 2014 (GB) .................................. 1405007.4

(51) Int. Cl.
*H03F 3/68* (2006.01)
*H03F 3/60* (2006.01)
(Continued)

(52) U.S. Cl.
CPC ............. *H03F 3/602* (2013.01); *H03F 3/189* (2013.01); *H03F 3/20* (2013.01);
(Continued)

(58) Field of Classification Search
CPC ............... H03F 3/60; H03F 3/68; H03F 3/602
(Continued)

(56) References Cited

U.S. PATENT DOCUMENTS 3,314,017 A * 4/1967 Riblet ..................... H03D 9/04
327/236
4,131,859 A * 12/1978 Valle ..................... H03F 1/3241
330/124 R
(Continued)

FOREIGN PATENT DOCUMENTS

WO    2008/135753 A1    11/2008

OTHER PUBLICATIONS

Lee, H.L., et. al, "Reconfiguable 2×2 Multi-Port Amplifier Using Switching Mode Hybrid Matrices", IEEE Microwave and Wireless Components Letters, vol. 24, No. 2, Feb. 2014.
(Continued)

Primary Examiner — Steven J Mottola
(74) Attorney, Agent, or Firm — Fish IP Law, LLP

(57) ABSTRACT

A multiport amplifier MPA is provided with an N-input input network, INET, an N-output output network, ONET, and N amplifiers interposed between the INET and the ONET, the MPA comprising N wanted signal paths and N.(N−1) null signal paths wherein N is divisible by 2, half of the N amplifier paths comprise a signal inversion with respect to the other half of the N amplifier paths, the INET and the ONET each comprise one or more quadrature hybrid couplers, QHC, wherein a pair of amplifier paths is arranged between the output of a first QHC in the INET and the input of a second QHC at the ONET, and each signal inversion is arranged in one of the amplifier paths of each pair of amplifier paths such that the ideal amplitude gain of at least one of the N.(N−i) null signal paths is zero.

15 Claims, 12 Drawing Sheets

(51) Int. Cl.
*H03F 3/189* (2006.01)
*H03F 3/20* (2006.01)

(52) U.S. Cl.
CPC .. *H03F 2200/192* (2013.01); *H03F 2200/198* (2013.01); *H03F 2200/204* (2013.01)

(58) Field of Classification Search
USPC .............................................. 330/124 R, 295
See application file for complete search history.

(56) References Cited

U.S. PATENT DOCUMENTS

| | | | | |
|---|---|---|---|---|
| 4,283,684 A | * | 8/1981 | Satoh ................... | H03F 1/3205 330/124 R |
| 5,729,174 A | * | 3/1998 | Dunnebacke ............. | H03F 3/68 330/124 R |

OTHER PUBLICATIONS

Masouros, C., "Maximizing Energy Efficiency in the Vector Precoded MU-MISO Downlink by Selective Perturbation", IEEE Transaction on Wireless Communications, vol. 13, No. 9, Sep. 2014.

Zhu Z. et. al, "Ka-band Multi-port Power Amplified Calibration Experiment and Results", 2010 Second International Conference on Advances in Satellite and Space Communications, 2010.

\* cited by examiner

| Port | 1 | 2 | 3 | 4 |
|---|---|---|---|---|
| 1 | 0 | $\alpha$ | 0 | $i\beta$ |
| 2 | $\alpha$ | 0 | $i\beta$ | 0 |
| 3 | 0 | $i\beta$ | 0 | $\alpha$ |
| 4 | $i\beta$ | 0 | $\alpha$ | 0 |

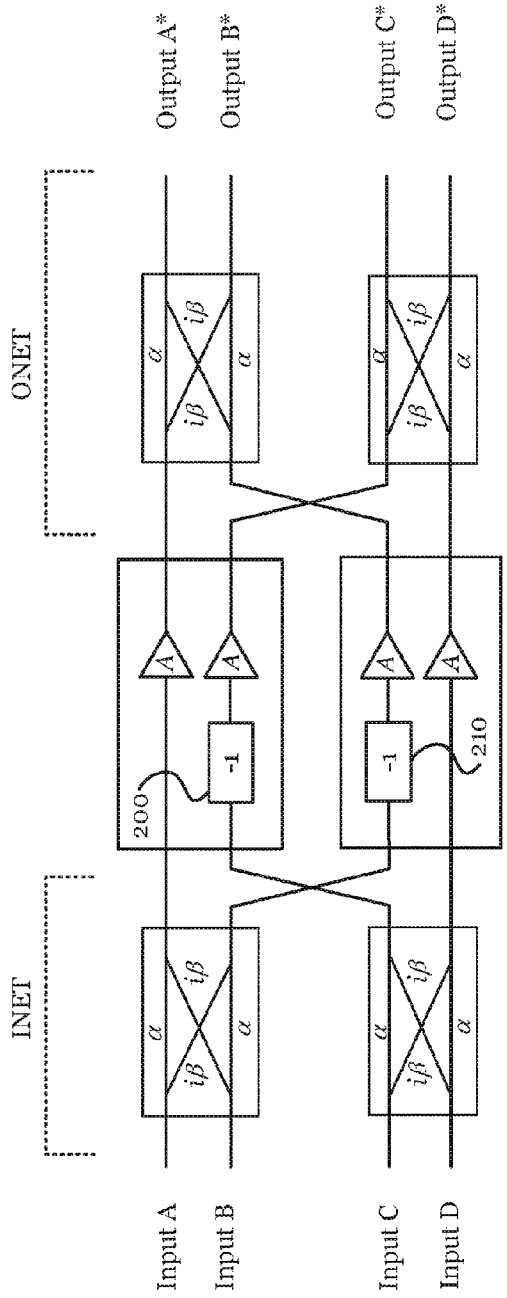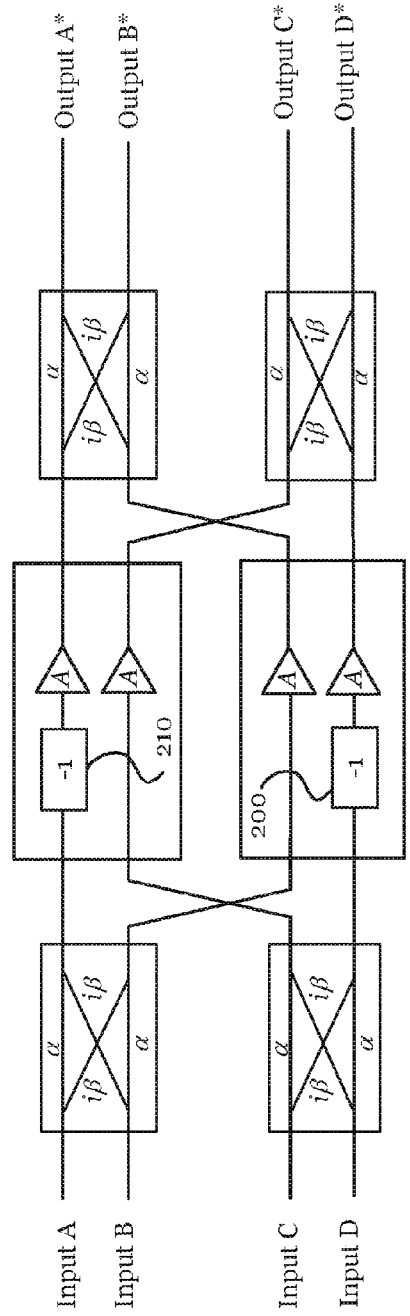
FIGURE 6a
FIGURE 6b

| Port | 1 | 2 | 3 | 4 |
|---|---|---|---|---|
| 1 | 0 | $\alpha$ | 0 | $-i\beta$ |
| 2 | $\alpha$ | 0 | $-i\beta$ | 0 |
| 3 | 0 | $-i\beta$ | 0 | $\alpha$ |
| 4 | $-i\beta$ | 0 | $\alpha$ | 0 |

ISOLATION IN A MULTI-PORT AMPLIFIER

This application is a U.S. National Stage filing of PCT/GB2015/050773, filed Mar. 17, 2016 which claims priority to U.K. Application No. 1405007.4, filed Mar. 20, 2014. This and all other extrinsic materials identified herein are incorporated by reference in their entirety.

The invention relates to isolation in a multiport amplifier (MPA), and particularly, but not exclusively, to broad-band isolation in MPAs using input networks and output networks constructed using quadrature hybrid couplers with imperfect amplitude balance.

An MPA is a well-known power amplifier device used for communications such as satellite communications. MPAs are generally operated at microwave frequencies above 1 GHz, for instance L & S bands with frequencies in the range 1.5 to 2.6 GHz, and Ku & Ka bands with frequencies in the region of 12 to 20 GHz, etc.

An MPA includes N inputs, N outputs, and N amplifier paths arranged as follows. The N inputs pass to an Input Network (INET), which has N outputs. Typically, the INET is a low power network implemented in any convenient transmission line technology that is appropriate to the circumstances, e.g. microstrip, stripline, coaxial cable, or waveguide. The N outputs from the INET each pass to one of N identical amplifiers, arranged in parallel. The amplifiers may be travelling wave tube (TWT) or solid state amplifiers. The N outputs from the amplifiers each pass to one of N inputs to an Output Network (ONET) which also has N outputs. The ONET is a high power network typically implemented using low loss transmission line technology. Theoretically, the ONET is a lossless network, that is to say the power entering at its inputs all appears at its outputs, with the exception of power lost to resistive transmission losses.

MPAs are used to allow the total power available from several amplifiers to be used in any or all of several signal paths. For a signal entering at any given MPA input, an output signal is generated at one particular output having been amplified by all N amplifiers. Ideally none of the signal appears at the other N−1 outputs.

The paths from an input to an unwanted output are referred to herein as "null paths". There are N wanted paths and N.(N−1) null paths through the MPA. The purpose of the MPA is that the total power of the N amplifiers is available to any or all of the N wanted signal paths in any proportion, simply dependent on the signal levels present. The quality of a MPA is determined by the isolation of the null paths, that is the excess of gain of the wanted paths over the gain of the null paths.

Typically, the ONET is mathematically a reciprocal of the INET, with inputs swapped for outputs. The symmetry enables the ONET and the INET to be of the same design. The INET and ONET each comprise an array of signal dividing waveguide devices. A Butler matrix or a network comprising hybrid devices is normally used for signal division, because such arrangements have convenient gain and phase shift properties. One type of hybrid coupler is a four-port signal dividing device known as a quadrature hybrid coupler (QHC) comprising two inputs and two outputs, as shown in FIG. 1a. A "scattering matrix" as shown in FIG. 1b represents the coupling of a signal at one particular port to another port. For simplicity, it will be assumed that the coupler has infinite return loss and infinite directivity over a particular frequency band, from which zeros can be inserted into the scattering matrix to represent zero coupling between ports on the same side of the coupler. "Direct" paths are those which have coupling $\alpha$, and coupled paths are those with $i\beta$, complex variable i representing a 90° (quadrature) phase shift. If the hybrid coupler is lossless, then $\alpha^2+\beta^2=1$.

FIG. 2 represents an example of a conventional 2×2 MPA, having a two input/2 output INET, a 2 input/2 output ONET, and two identical amplifiers of gain A interposed between the two outputs of the INET and the two inputs of the ONET. The INET and ONET are each formed of a QHC as defined in FIGS. 1a and 1b. Coupling from input A to put A* via path 1 is $i\alpha A\beta$. Coupling from input A to output A* via path 2 is also $i\alpha A\beta$. Thus the amplitude gain for the wanted path from Input A to Output A* is $2i\alpha A\beta$. It will be appreciated that the gain for the wanted path from Input B to Output B* is the same, by symmetry.

Now consider the supposed null path from Input A to Output B*. The coupling from Input A to Output B* via path 1 is $\alpha^2 A$, whilst that via path 2 is $-\beta^2 A$. Thus the gain of the supposed null path is $(\alpha^2-\beta^2)A$. Let $\alpha^2-\beta^2=e$, for simplicity of notation. It will be appreciated that the gain for the null path between Input B and Output A* is the same, by symmetry.

The isolation of a supposed null path relative to a wanted path, in terms of the ratio of the power on each path expressed in decibels (dB) is therefore $10\,\text{Log}_{10}((2\alpha\beta/e)^2)$.

Quantity e is a function of frequency, because the frequency determines the degree of imbalance between $\alpha$ and $\beta$. Consequently, only in the special case of frequency $f_0$, where $e=0$, does the isolation become infinite. In other cases, at other frequencies, f*, where e=e*, the isolation approximates to $10\,\text{Log}_{10}(1/e^{*2})$, which is non-zero.

For an MPA using an INET and ONET constructed from conventional QHCs, the MPA isolation is therefore determined by the amplitude imbalance of the individual QHCs, and its variation with frequency. It is thus impossible to construct an MPA according to the prior art using QHCs and maintain perfect isolation across a wide frequency band. Since the constraint on isolation is determined by the INET and the ONET and how they are interconnected, it cannot be relieved by adjustment or correction in the amplifier paths. In other words, it is not possible to improve the null path isolation beyond that of the "Equivalent Passive MPA". The Equivalent Passive MPA is defined as the MPA with the amplifiers removed to leave just any delay and gain adjustment components (which may be present to compensate for amplifier performance) providing the connections between INET and ONET. Regardless of these delay and gain adjustment components, the null path isolation of the Equivalent Passive MPA is determined solely by the properties of the INET and the ONET.

It is therefore an aim of the present invention to circumvent the lack of isolation in a conventional MPA.

According to an aspect of the present invention, there is provided an N×N multiport amplifier MPA, comprising an N-input input network, INET, an N-output output network, ONET, and N amplifiers interposed between the INET and the ONET, the MPA comprising N wanted signal paths and N.(N−1) null signal paths wherein N is divisible by 2, half of the N amplifier paths comprise a signal inversion with respect to the other half of the N amplifier paths, and the INET and the ONET each comprise one or more quadrature hybrid couplers, QHC, the input of each QHC comprising a pair of signal paths, and the output of each QHC comprising a pair of signal paths, wherein a pair of amplifier paths is arranged between the output of a first QHC in the INET and the input of a second QHC at the ONET, and each a signal inversion is arranged in one of the amplifier paths of each pair of amplifier paths such that the ideal amplitude gain of at least one of the N.(N−1) null signal paths is zero.

The INET and ONET may have the same frequency response, with respect to the gain and phase change of a signal of a particular frequency passing through the INET or ONET.

The one or more QHCs may be formed of a broad wall and/or a narrow wall short slot hybrid junction.

The MPA may comprise means for compensating for phase and amplitude errors in the amplifier paths, to further improve isolation.

The amplifier paths may comprise waveguides, and signal inversion may be achieved independent of frequency by changing the sequence of E-plane and H-plane bends in the waveguide of one of the amplifier paths of each pair of amplifier paths relative to that in the other. This approach enables the inversion to be achieved without the use of additional components.

Signal inversion independent of frequency may be achieved by changing the chirality of a 90° degree twist in the waveguide of one of the amplifier paths of each pair of amplifier paths relative to that in the other. This approach again avoids use of additional components.

Signal inversion independent of frequency may be achieved by replacing a straight waveguide in one of the amplifier paths of each pair of amplifier paths by a waveguide comprising a 180° twist, such a twist being relatively simple to manufacture.

The signal inversion may be achieved independent of frequency by physically inverting a waveguide-to-coaxial transition in one of the amplifier paths of each pair of amplifier paths relative to that in the other.

The signal inversion may be achieved independent of frequency by placing an inverting transformer in one of the amplifier paths of each pair of amplifier paths, and a non-inverting transformer in the other.

The signal inversion may be achieved independent of frequency by placing an inverting amplifier in one of the amplifier paths of each pair of amplifier paths, and a non-inverting amplifier in the other.

A signal inversion may also be achieved at one frequency, and approximately over a narrow frequency band, using a half wavelength of additional transmission line in one path relative to the other.

A signal inversion may be obtained approximately over a finite frequency band by placing a length of waveguide in one path and a suitable length of waveguide in another path but with a different and appropriate cross section such that a relative 180° degree phase shift is approximately obtained.

The signal inversion may be arranged to be performed between the INET and the amplifier in the amplifier path.

The signal inversion may be arranged to be performed between the amplifier and the ONET in the amplifier path.

N may be a power of 2, and in such cases the signal inversion(s) is/are arranged such that the ideal gain of all of the N.(N−1) null signal paths is zero, which provides optimum performance.

According to another aspect of the present invention, there is provided an MPA comprising an N-input input network, INET, an N-output output network, ONET, and N amplifiers interposed between the INET and the ONET, the MPA comprising N wanted signal paths and N.(N−1) null signal paths in which $N=2^L$ for integer L, the INET and the ONET each comprise one or more quadrature hybrid couplers, QHC, the input of each QHC comprising a pair of signal paths, and the output of each QHC comprising a pair of signal paths, and a pair of amplifier paths is arranged between the output of a first QHC in the INET and the input of a second QHC in the ONET, wherein the quadrature phase shift of the coupling of a QHC of a predetermined rank in the INET is in the opposite direction to that of the coupling of a QHC of the same predetermined rank in the ONET.

Embodiments of the present invention will now be described, by way of example, with reference to the Figures, in which:

FIG. 1a shows an example of the signal coupling achieved using a QHC;

FIG. 1b shows a scattering matrix for the QHC of FIG. 1a;

FIGS. 6a and 6b show representations of a 4×4 MPA according to an embodiment of the invention;

FIG. 8a shows an example of the signal coupling achieved using a QHC according to another embodiment of the present invention;

FIG. 8b shows a scattering matrix for the QHC of FIG. 8a;

To assist with understanding of the following description, the following axioms are presented, which are true for all N×N MPAs to which the invention is applicable:
1) An N×N MPA consists of an N-input, N-output INET and an N-input, N-output ONET with N identical amplifiers interposed between the N outputs of the INET and the N inputs of the ONET.
2) N is a positive integer which determines the size of the MPA.
3) The N amplifiers have, after calibration, identical amplitude gain A, and insertion phase at any given frequency within a defined frequency band B.
4) The INET and the ONET are composed of QHCs and, in the cases where N is not a power of 2, fixed phase shifts, as in a Butler matrix.
5) The "Rank" of a QHC within an INET is one plus the number of additional QHCs to be passed through to reach the outputs from the INET. The rank of a QHC within an ONET is one plus the number of QHCs passed through to reach that QHC, from an input to the ONET.

The following additional assumptions apply to the ideal QHCs from which the INET and ONET are constructed. The real QHCs are assumed to deviate from these ideals only insofar as occurs due to imperfections of design and manufacture:
6) All the QHCs are theoretically lossless.
7) All the QHCs have infinite return loss and infinite directivity over the defined frequency band B.

8) The QHCs maintain a phase difference between outputs of 90° exactly (for the purpose of explanation) over the frequency band B. This follows mathematically from assumption 7). The phase difference is represented herein as the imaginary numbers i or −i depending on the particular type of QHC, as will be described in more detail below.

Figure 3:
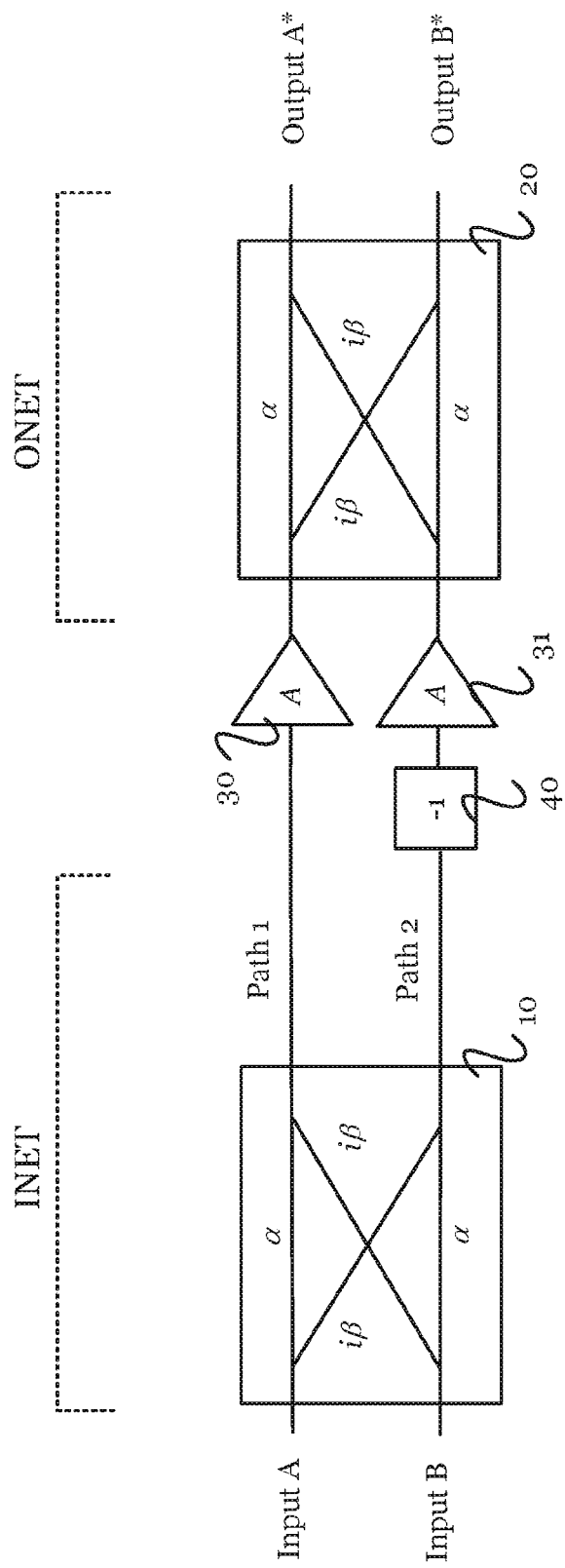
FIG. 3 shows a 2×2 MPA according to an embodiment of the present invention.

FIG. 3 shows an example of a 2×2 MPA according to an embodiment of the present invention. The MPA comprises an INET having a QHC 10, and an ONET having a QHC 20 which is the same in design and functionality as the INET QHC 10. The MPA has two amplifier paths between the INET and the ONET, each containing an amplifier 30, 31 of gain A, and there is an inverter 40, introducing a signal inversion (or multiplication by −1) which may be made independent of frequency, before the amplifier 31 in the second path. In a modification of the present embodiment, the signal inversion may be produced within or after the amplifier in the second path. The amplifiers may be formed of any of a number of conventional amplifier devices as known in the art, which are identical to each other in terms of structure and function. An example is a pair of matched travelling wave tube amplifiers. The MPA has two inputs, A and B, and two outputs, A* and B*.

Figures 1A, 1B:
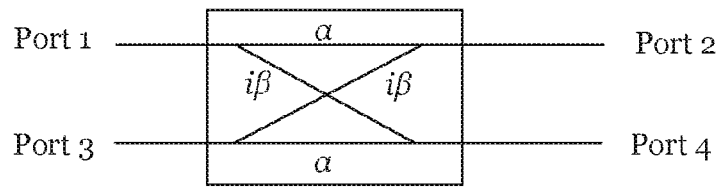

Each QHC 10, 20 performs coupling of an input signal to two output paths, and may be of the type illustrated in FIG. 1a and defined by its scattering matrix in FIG. 1b. The INET QHC 10 couples a portion of a signal at input A to a first amplifier path via what will be referred to as a "direct" path, with gain $\alpha$. Another portion of the signal at input A is coupled to the second amplifier path via what will be referred to as a "coupled" path, with gain $\beta$. A signal passing through the coupled path experiences a phase shift of 90° with respect to a signal passing through the direct path, and the phase shift shall be represented by multiplication with complex variable i, so that the gain through the coupled path is $i\beta$.

By symmetry, the direct and coupled paths respectively apply gains of $\alpha$ and $i\beta$ to signals received at input B, and respectively couple these signals to the second and first amplifier paths.

Furthermore, due to the same design being used at the ONET QHC 20, direct and coupled paths couple signals from the amplifier outputs to outputs A* and B*.

Consider a "wanted path" as corresponding to a mapping between an input of the MPA and an output which are linked by a direct path through the QHCs 10, 20, so that the phases of the input and output signals match. The wanted path therefore includes the direct signal, and other coupled paths which connect the same input and the output. The amplitude gain of the wanted path is therefore $(\alpha^2+\beta^2)A=A$ for the path from input A to output A*, since this is the sum of the direct paths through both the INET QHC 10 and the ONET QHC 20 with gain a (giving a product of $\alpha^2 A$), and the coupled paths with gain $i\beta$ through both QHCs, with the additional phase inversion (giving a product of $-(i\beta.i\beta)A=\beta^2 A$). Similarly the total gain is −A for the path from input B to output B*. Axiom (6) above is the basis of the assumption that $\alpha^2+\beta^2=1$.

In addition to the wanted paths, the MPA also contains "null" signal paths (those which are not "wanted", where the input and output signals are out of phase). The null paths in the embodiment of FIG. 3 connect input A with output B*, and input B with output A*.

The gain of the coupling between input A and output B* is $\alpha.A.(i\beta)-(i\beta).A.\alpha=0$. In these products, the terms $\alpha$, A and $\beta$ are written in the order in which their respective gains are applied to a signal passing from the input of the MPA to the output, in other words $\alpha.A.(i\beta)$ represents a direct path followed by a coupled path, whereas $(i\beta).A.\alpha$ represents a coupled path followed by a direct path. For either combination of paths, a 90° phase shift is introduced.

Since the gain of the null path is zero, the isolation due to the imbalance of the couplers is theoretically infinite. This is true irrespective of frequency, which alleviates the bandwidth constraint which is conventionally applied to MPAs making use of QHCs, due to amplitude imbalance caused by changes in frequency.

The foregoing discussion has assumed that the quadrature phase relationship of the quadrature hybrid couplers is perfect in accordance with assumptions (7) and (8). It will now be shown that the invention also causes MPA isolation to approach perfection in the cases where the quadrature phase relationship deviates from the ideal of 90° due to imperfections in the design of the quadrature hybrid couplers, in other words where the gain of the coupling path is not represented as $(i\beta)$ with respect to a real path of gain $\alpha$.

If axiom (7) no longer holds, there are two consequences. Firstly, forward waves incident at the inputs to the couplers will result in reverse waves due to the imperfect input return loss and the imperfect directivity. These imperfections will result in mismatch and ripple effects when combined with the output return losses of preceding devices. These second order effects are ignored in this analysis. Secondly, assumption (8) no longer strictly holds, but becomes an approximation. Thus it must now be assumed that the phase angle between the quadrature coupler outputs is $\pi/2+\varphi$ radians, where $\varphi$ is a small phase error. For the purposes of the subsequent discussion, it will continue to be assumed that all couplers within the MPA of the same design have the same behaviour. It will also be assumed that the amplitude balance is perfect with no loss of generality, since it has already been shown above that amplitude imbalance can be overcome by the invention. In other words, it will be assumed that $\alpha^2=\beta^2$. Thus we will assume that the coupling amplitude is $C=1/\sqrt{2}$ in the following discussion and diagrams.

Figure 2:
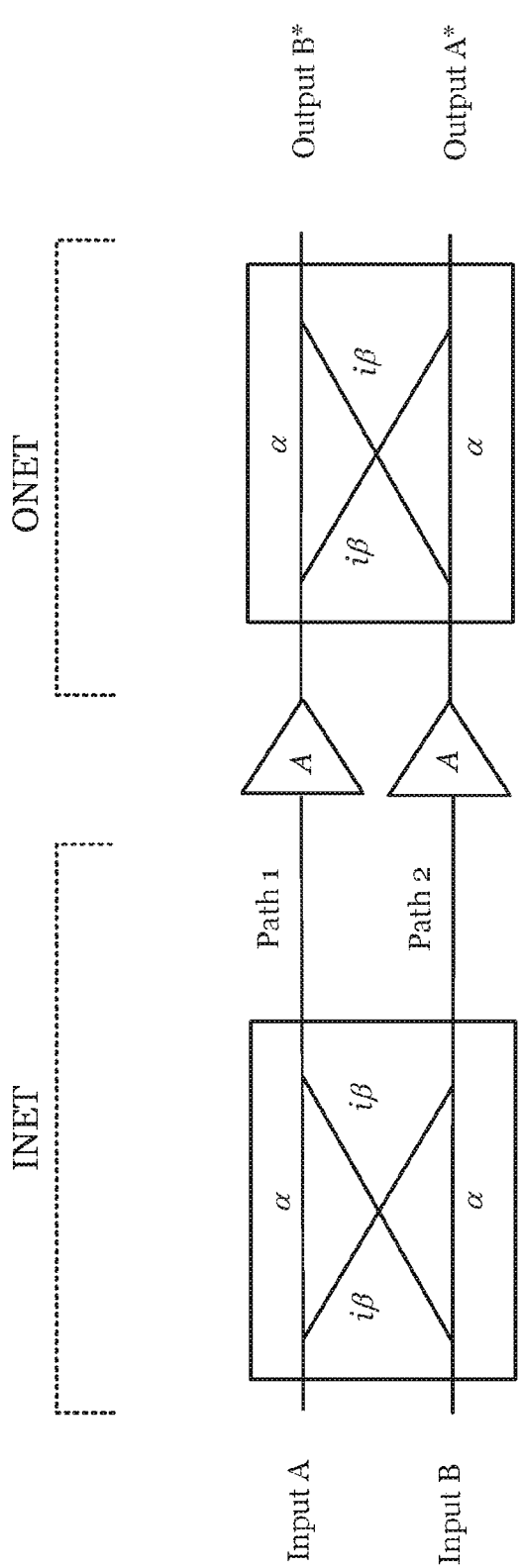
FIG. 2 shows a conventional 2×2 MPA.

Consider the conventional 2×2 MPA of FIG. 2, in which the direct paths have gain C, and the coupled paths have gain C, with phase change of $\pi/2+\varphi$ rather than $\alpha$ and $i\beta$ respectively.

The amplitude gain through the wanted path from input A to output A* via amplifier path 1 is: C.A.C at a phase angle of: $\pi/2+\varphi$. The amplitude gain phase via path 2 is the same, thus the total gain is: $2.(C^2.A)=A$ at a phase angle of $\pi/2+\varphi$. By symmetry the gain and phase of the wanted path from input B to output B* is the same.

Now consider the supposed null path from input A to output B*. The amplitude gain via path 1 is C.A.C at a phase angle of 0, whilst the amplitude gain via path 2 is also C.A.C but at a phase angle of $\pi+2\varphi$. The total gain is thus $2A \sin(\varphi/2) \approx \varphi.A$. This is non-zero, and giving a null path isolation of $-20\log(\varphi)$ dB. By symmetry the isolation of the other null path from input B to output A* is the same.

Now consider the 2×2 MPA designed according to the invention as shown in FIG. 3, in which the direct paths have gain C, and the coupled paths have gain C, with phase change of $\pi/2+\varphi$, rather than gains of $\alpha$ and $i\beta$ respectively. The amplitude gain through the wanted path from input A to output A* via amplifier path 1 is: C.A.C at a phase angle of 0, whilst the amplitude gain via path 2 is also C.A.C but at a phase angle of $2\varphi$. The total gain is then $C^2.A\sqrt{2+2\cos(2\varphi)} \approx A$ at a phase angle of $\varphi$.

Similarly the gain of the wanted path from input B to output B* is also $C^2.A\sqrt{2+2\cos(2\varphi)} \approx A$, but at a phase angle of $\pi+\varphi$. Thus the path from input B to output B* is inverted compared to the path from A to A*.

Now consider the null path from input A to output B*. The amplitude gain via path 1 is C.A.C at a phase angle of $\pi/2+\varphi$, whilst the amplitude gain via path 2 is also C.A.C but at a phase angle of $\pi+\pi/2+\varphi$. The two components are thus anti-phase and cancel completely. The null path gain is thus 0, giving theoretically infinite isolation. By similar reasoning, the isolation of the other null path from input B to output A* is also infinite.

In conclusion, for a 2×2 MPA designed according to the invention, infinite theoretical isolation is achieved despite the phase errors of the individual quadrature hybrid couplers, where these are common due to the common design. Thus infinite isolation is achieved despite both the phase quadrature and amplitude balance errors of the couplers, provided these are of common design.

This result is significant as it illustrates that the concept underlying the present invention does not hold true only in an abstract environment of idealized couplers, but is also valid with non-ideal couplers having finite return loss and directivity.

Figure 4:
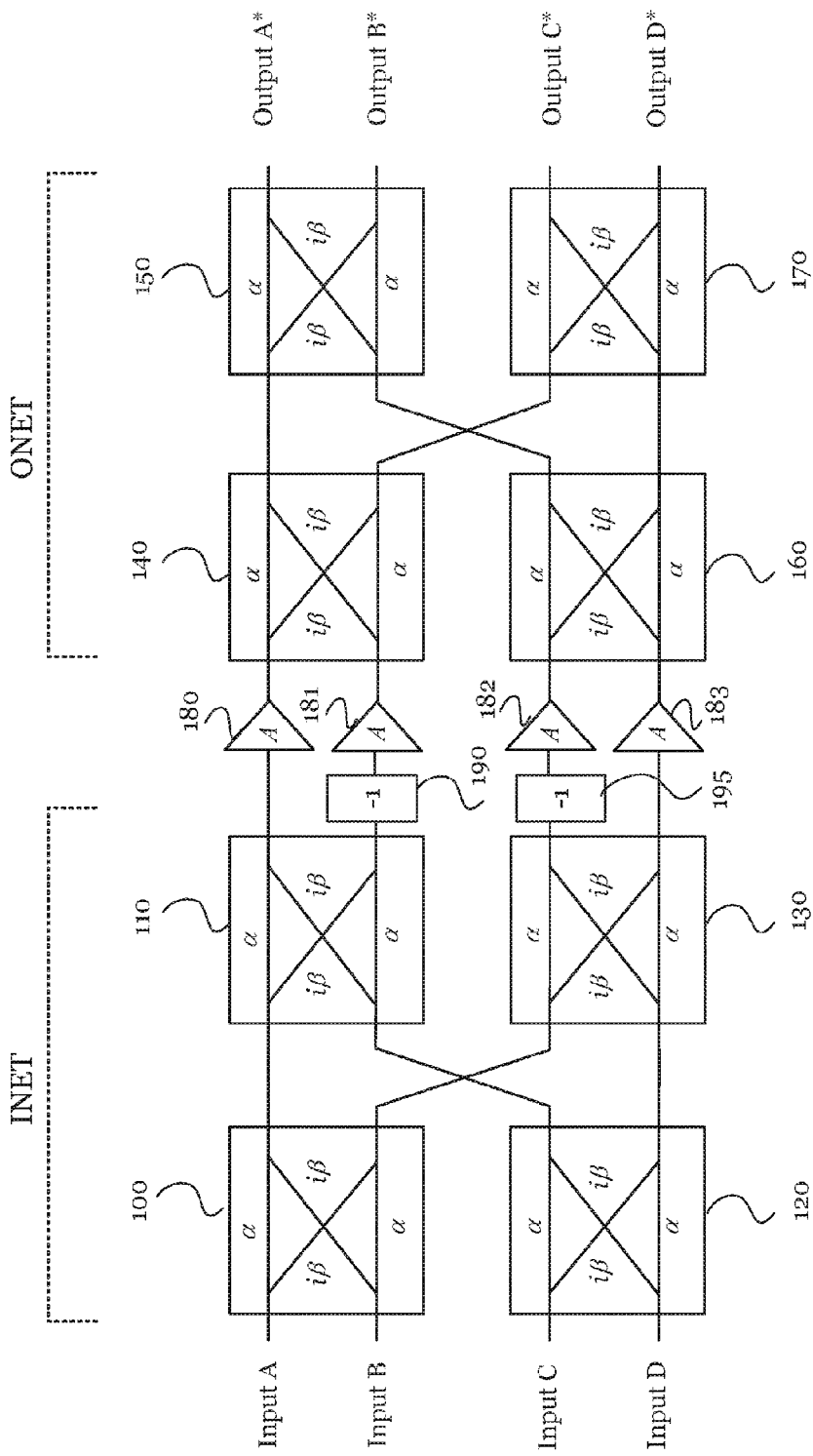
FIG. 4 shows a 4×4 MPA according to an embodiment of the present invention.

FIG. 4 shows an example of a 4×4 MPA according to another embodiment of the present invention. The 4×4 MPA is constructed using the same principles as the 2×2 MPA of FIG. 3. Here, four inputs A, B, C and D are coupled to four outputs, A*, B*, C* and D* via four amplifier paths through amplifiers 180, 181, 182, 183. The INET and the ONET each contain four QHCs coupled as shown in FIG. 4. The QHCs in each network are divided into two ranks. A first rank, in the case of the INET, represents QHCs 110, 130 receiving an input from another QHC and providing an output to an amplifier, whereas in the case of the ONET the first rank represents QHCs 140, 150 receiving a signal from the amplifier and outputting it to another QHC. These are the "innermost" QHCs. A second rank, in the case of the INET, represents QHCs 100, 120 receiving a signal from one of the MPA inputs, and outputting a signal to another QHC. In the case of the ONET, the second rank represents QHCs 150, 170 receiving an input from another QHC, and providing an output of the MPA. These are the "outermost" QHCs.

In both the INET and the ONET, there are two QHCs of each rank. In the present embodiment, all QHCs of a particular rank, are of the same design and have the same coupling coefficients, regardless of whether the QHC is in the INET or the ONET.

Inverters 190, 195 are present in the second and third amplifier paths.

The wanted paths are the four paths from input A to output A*, from input B to output B*, from input C to output C*, and from input D to output D*.

For a mapping between input A to output A*, there are four signal paths:
1) QHC 100→QHC 110→Amplifier 180→QHC 140→QHC 150, gain $\alpha^4 A$.
2) QHC 100→QHC 110→Inverter 190→Amplifier 181→QHC 140→QHC 150, gain $\alpha\beta A\beta\alpha = \alpha^2\beta^2 A$.
3) QHC 100→QHC 130→Inverter 195→Amplifier 182→QHC 160→QHC 150, gain $\beta\alpha A\alpha\beta = \alpha^2\beta^2 A$.
3) QHC 100→QHC 130→Amplifier 183→QHC 160→QHC 150, gain $\beta^4 A$.

As in the first embodiment, output signals at all of the wanted paths are in phase with the input signals, and by symmetry, the same applies to the wanted paths from inputs B, C and D. The total gain for a wanted path between input A and output A* is $(\alpha^4+2\alpha^2\beta^2+\beta^4)A = (\alpha^2+\beta^2)^2 A = A$.

The null paths are the remaining 12 paths through the MPA, namely from input A to outputs B*, C*, D*, from input B to outputs A*, C*, D* and so on.

Figures 5A, 5B:
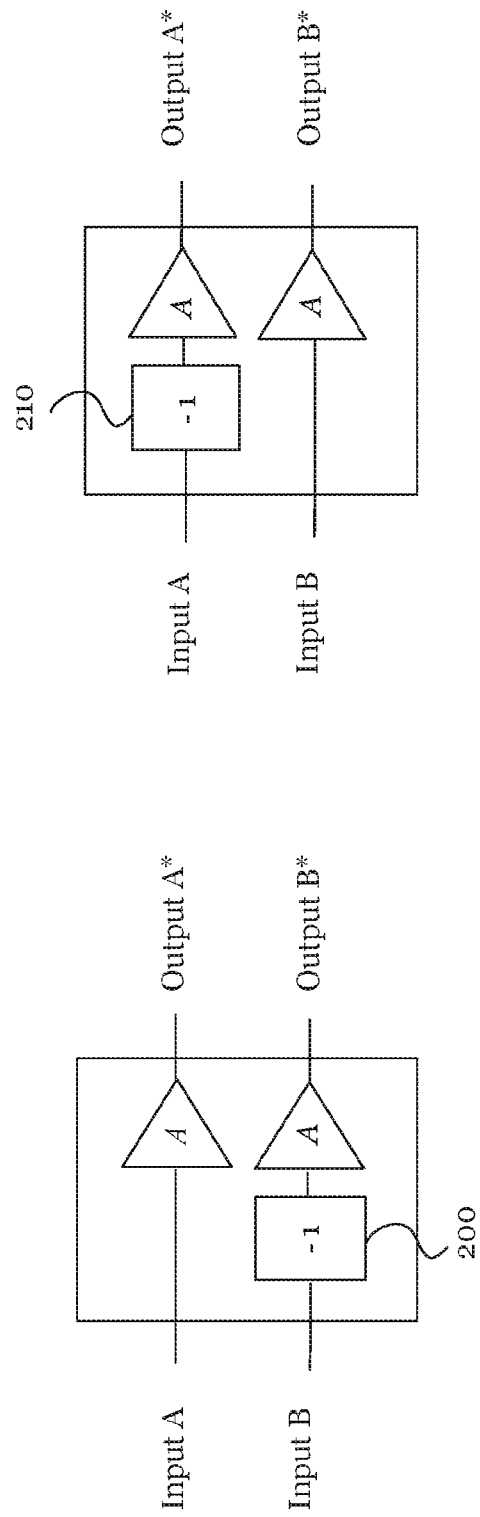
FIGS. 5a and 5b show functional representations of a 2×2 MPA according to an embodiment of the invention.

Using the same analysis as shown above, the gain of each null path can be seen to be zero, and so the isolation of the MPA is theoretically infinite, with respect to all null paths. For example, from input A to output B*, the output is:
$\alpha^8.A.(i\beta) - \alpha.(i\beta).A.(i\beta).(i\beta) - (i\beta).\alpha.A.\alpha^2 + (i\beta).(i\beta).$
$A.(i\beta).\alpha = (\alpha^3 i\beta + i\beta^3 \alpha - i\beta\alpha^3 - i\beta^3\alpha)A = 0.$ The 2×2 MPA of FIG. 3 behaves as a system as represented in FIG. 5a: The path from Input A to output A* has gain A, the path from Input B to output B* has gain −A, and these two wanted paths are totally isolated from each other by virtue of the zero gain in the two null paths. By symmetry, it can be seen that had the inverter 40 in FIG. 3 been placed in Path 1 instead of Path 2, the behaviour of the 2×2 MPA as a system would be as represented in FIG. 5b. The effect of the single inverter is, in combination with the QHCs, to ensure that wanted signals are combined in phase, and null signals are combined in antiphase, so that the null signals cancel out, and so the inverter can be placed in either amplifier path. However, placing the inverter 40 in amplifier Path 1 of FIG. 3 results in the 2×2 MPA system behaviour shown in FIG. 5b with a virtual inversion 210 in the A path, whilst placing the inverter 40 in amplifier Path 2 of FIG. 3 results in the 2×2 MPA system behaviour shown in FIG. 5a with a virtual inversion 200 in the B path.

For a 4×4 MPA, however, while the inverter can be placed in either amplifier path for a particular pair of amplifier paths, the position of the inverter in one pair dictates the position of the inverter in another pair of amplifier paths. In the embodiment of FIG. 4, if an inverter is arranged in the path through the second amplifier 181, then an inverter must be placed in the path through the third amplifier 182 in order to achieve the desired result. Alternatively, if an inverter is arranged in the path through the first amplifier 180, then an inverter must be placed in the path through the fourth amplifier 183 in order to achieve the desired result. Mathematically, it will be appreciated that if inverters are arranged in other combinations of paths, such as amplifier paths 2 and 4, or in paths 1 and 3, the isolation of the invention will not be achieved.

A 4×4 MPA can be seen as a parallel combination of two 2×2 MPAs, using the representations of FIGS. 5a and 5b, together with two further input QHCs and two further output QHCs, resulting in the structures of FIG. 6a or 6b, dependent upon the nature of the combination. For example, if the representation of FIG. 5a is selected to receive inputs from the upper output paths of the input QHCs, and the representation of FIG. 5b is selected to receive inputs from the lower output paths of the input QHCs, the result is the arrangement of FIG. 6a, which represents the MPA shown in FIG. 4. If the representation of FIG. 5b corresponds to inputs from the upper output paths of the input QHCs, and the representation of FIG. 5a corresponds to inputs from the lower output paths of the input QHCs, the result is the arrangement of FIG. 6b.

In general the construction of a MPA of size $2^L \times 2^L$ may be considered as a synthesis from two smaller MPAs of size $2^{L-1} \times 2^{L-1}$ together with an additional rank of QHCs in the INET and an additional rank of QHCs in the ONET. For each QHC in the additional rank of the INET, one output is routed to one of the smaller MPAs whilst the other output is routed to the other smaller MPA. Similarly for each QHC in the additional rank of the ONET, one input is routed from one of the smaller MPAs whilst the other input is routed from the other smaller MPA. If the synthesis is according to the invention, then all the signal paths in one of the smaller MPAs include an inversion with respect to the equivalent paths of the other smaller MPA. Generally, for a $2^L \times 2^L$ MPA there are $L.2^L$ QHCs in total, including both INET and ONET. This is because there are $(2^L)/2$ QHCs in each rank of both INET and ONET, and there are L ranks in the INET and L ranks in the ONET.

For example, the INET and ONET of a 2×2 MPA each have one QHC, whereas the INET and ONET of a 4×4 MPA as shown in FIG. 4 each require four QHCs in order to derive the routing of signals from a particular input through each of the amplifiers.

An 8×8 MPA can be obtained by combining both representations of a 4×4 MPA as shown in FIGS. 6a and 6b in parallel, i.e. a combination of the representation of FIG. 6a and an "inverted" representation of FIG. 6a. A 16×16 MPA is similarly built up using combination of the 8×8 MPA and an "inverted" 8×8 MPA, and so on. It can thus be seen that the architecture of all M×M MPAs, where $M=2^L$ for integer L, can be similarly derived.

Figure 7:
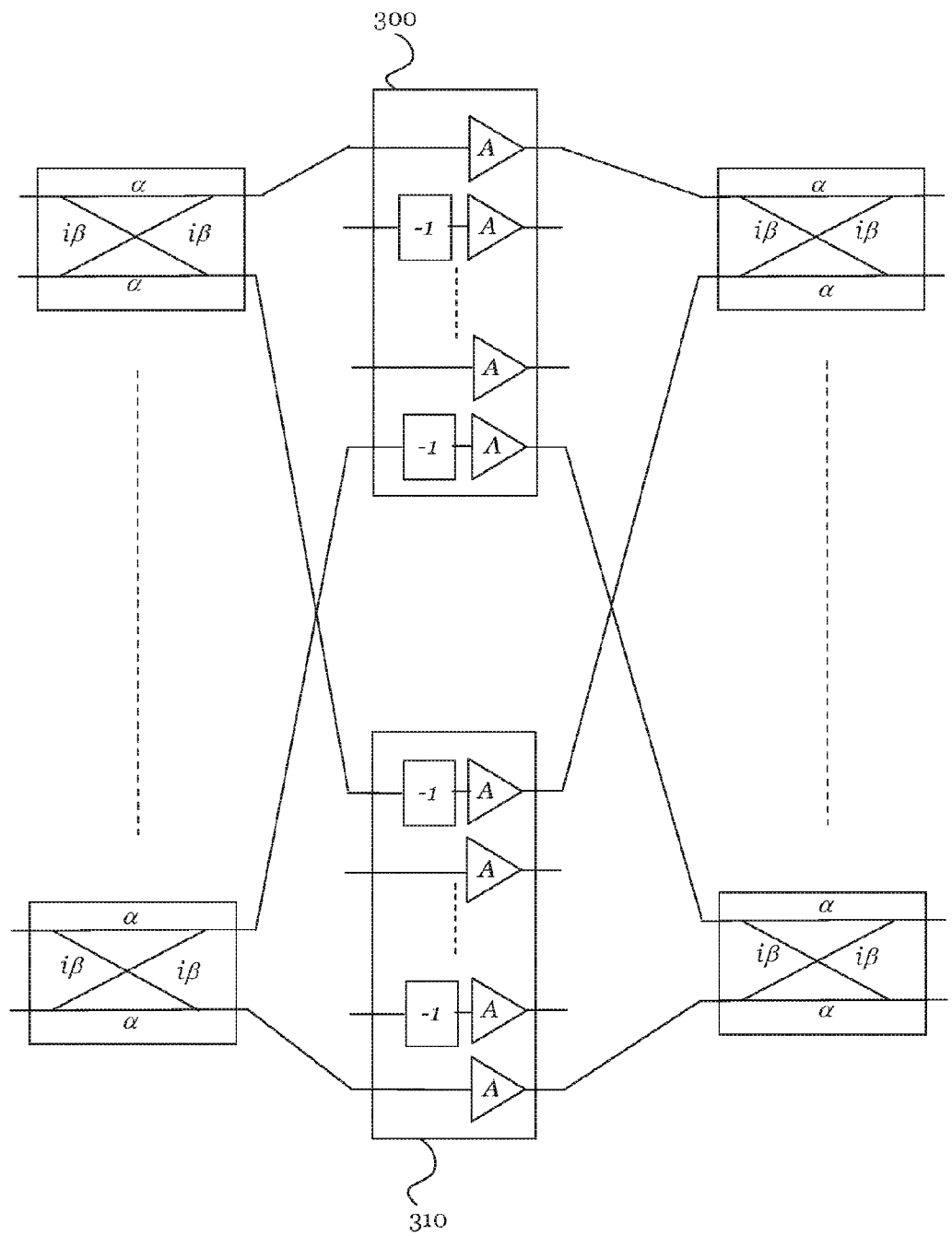
FIG. 7 shows a general case of an N×N MPA, where N is a power of two, according to an embodiment of the present invention.

In general terms, the theoretically infinite isolation of an MPA constructed according to the invention can be shown as follows. Consider the construction of an MPA of size $2^{(L+1)} \times 2^{(L+1)}$ from two MPAs 300, 310 of size $2^L 33\ 2^L$, as shown in FIG. 7. The MPA of size $2^{(L+1)} \times 2^{(L+1)}$ has $2^L$ input rank QHCs and $2^L$ output rank QHCs, although only two INET and two ONET QHCs are shown in FIG. 7 for simplicity. In one of the size $2^L \times 2^L$ MPAs 300, all inverted amplifier paths are swapped for non-inverted amplifier paths compared to the other size $2^L \times 2^L$ MPA 310. For simplicity, connections for some amplifier paths are omitted, but these can be derived by induction from the explanation of the 2×2 and 4×4 MPAs set out above.

Each of the smaller $2^L \times 2^L$ MPAs 300, 310 (one being inverted) can be described as one of a "pair" of MPAs connected in parallel in the way described above with respect to FIGS. 6a and 6b. As such, the performance of an individual $2^L \times 2^L$ MPA is equivalent to that of a 2×2 MPA as described with reference to FIG. 3, and thus has infinite isolation as an MPA. It therefore follows that the $2^{(L+1)} \times 2^{(L+1)}$ MPA has infinite isolation in all of its null paths, since the $2^{(L+1)} \times 2^{(L+1)}$ performance is equivalent to that of a 4×4 MPA described with reference to FIG. 4. Since the invention can be shown to work for L=1 and for L=L+1, it therefore follows by induction that it works for all L, giving theoretical infinite isolation for all paths. As such, a higher-order MPA can always be synthesised using building blocks of a pair of lower-order MPAs plus additional input and output QHCs.

In the embodiments described above, it has been stated that the infinite isolation, and total cancellation of the null paths is an ideal, or theoretical scenario. In practice, there may be limitations to the extent to which this can be achieved. Such limitations will arise due to slight differences in matching of the INET and ONET QHCs, caused by manufacturing tolerances, and phase and amplitude uncertainties of the individual amplifiers.

As set out in the introduction of this description, the design of the INETs and ONETs of the invention is such that the "equivalent passive MPA", namely an MPA with the amplifier components removed, is optimised, since errors introduced by the amplifiers will require compensation at the amplifiers themselves. Each amplifier may typically introduce some phase error, which can be compensated through the inclusion of various fine phase insertions, in addition to the inversion contained in one of the amplifier paths. Conventionally, "commandable phase adjusters" are used to perform such compensation, but such adjusters have not previously been used in combination with an inverter as in the invention, to provide a particular isolation benefit. Instead, the only additional use of commandable phase adjusters has been in the use of signal steering within an MPA, in order to route a signal to a particular output.

Ideally, each amplifier should be identical in terms of its gain-frequency characteristics, but manufacturing errors may result in slight differences between signal paths. The mathematics set out above is based on the assumption that all of the gains are equal. In view of the fact that the isolation of a particular MPA may be imperfect in practice, however, the arrangement of embodiments of the invention in terms of the selection of amplifier paths in which the inverters are to be included, can be understood in functional terms, namely a selection of paths which enables the theoretical maximum isolation to be infinite.

The embodiments of the present invention have been described in connection with the use of quadrature hybrid couplers, which are effective in terms of both performance and ease of manufacture. In some embodiments, the QHCs used for both INETs and ONETs are variants of the narrow wall short-slot hybrid junction first described by Henry J. Riblet in the Proceedings of the I.R.E, February 1952, and the broad wall variant of this junction. Such couplers comprise two adjacent waveguides, with coupling achieved through an opening or slot, in the dividing wall. The slot can either be in the narrow wall or the broad wall of a rectangular profile waveguide. These arrangements have small size and are suitable for building into larger networks of hybrid couplers, and as such are advantageous. The two main variants of these couplers differ in that for a narrow wall (side wall) coupler, the coupled path output lags the main guide path by 90°, whereas for a broad wall (top wall) coupler, the coupled path output leads the main guide path by 90°, and so this must be taken into account when assessing the overall phase shift applied to a signal input to the MPA.

For reasons of physical constraint, physical implementations of INETs and ONETs may employ both narrow wall and broad wall short slot quadrature hybrids in different ranks of the INET and the equivalent ranks of the ONET.

A particular type of QHC is a "3 dB" hybrid, in which the power transferred in a direct path is equal to the power transferred in the coupled path. In other words, $\alpha=\beta$, as used in the expressions set out above. Such couplers may be used in embodiments of the invention.

QHCs are preferred to so-called "Magic T" or "Magic Tee" hybrids, which have conventionally been used to address the bandwidth constraint problem solved by embodiments of the invention. Magic T hybrids, which are four-port couplers in which any three of the ports are perpendicular to each other, provide a frequency-independent coupling with no crossover components, and thus give good broad band operation in theory. However, Magic T hybrids are difficult to engineer in practice so as to give good return loss over a wide frequency band. For these reasons, the use of QHCs, together with an inverter, as in embodiments of the invention, is an optimal solution.

This is particularly apparent when the structure of the inverter is considered, which is simple and elegant, in embodiments of the present invention. A signal inversion may be placed in a signal path relative to that in another path without changing the delay in the path by many means, including any of the following:

in a waveguide, by changing the sequence of E plane and H plane bends in one waveguide signal path relative to that in the other;

in a waveguide, by changing the handedness (chirality) of a waveguide 90 degree twist in one path relative to that in the other;

in a waveguide by replacing straight waveguide in one path by a 180 degree twist in the other;

inverting a waveguide to coaxial transition in one path relative to that in the other;

placing an inverting transformer in one path and a non-inverting transformer in the other;

placing an inverting amplifier in one path and a non-inverting amplifier in the other;

using a half wavelength of additional transmission line in one path relative to the other, for a particular frequency; or placing a length of waveguide in one path and a suitable length of waveguide in another path but with a different an appropriate cross section such that a relative 180 degree phase shift is approximately obtained between the paths over a finite frequency band.

Consequently, the inversion is achieved via effective use of the physical architecture of the MPA. In embodiments of the invention, the INET output is a waveguide, and a transition is used in order to provide a coaxial input to the amplifier. The amplifier output is a waveguide. The waveguides of the invention support any particular transmission mode, and convey acoustic, electromagnetic or optical waves. By bending or twisting a waveguide, or physically inverting transitions in particular amplifier paths, the required inversion can be achieved. There is thus no need for a complex device such as a commandable phase adjuster, which is not intended to achieve the isolation of the present invention. There is also no need for an inverter at all in half of the amplifier paths disclosed.

Figures 8A, 8B:
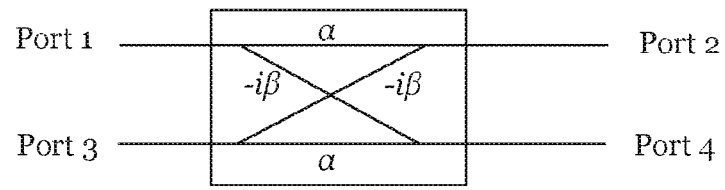

In the embodiments described above, a QHC has been described with reference to the coupling configuration shown in FIG. 1a and defined in FIG. 1b. It is also possible for a different coupling arrangement to be used in embodiments of the invention, however, as shown in FIG. 8a and defined in its scattering matrix in FIG. 8b. For simplicity of description, the QHC of FIGS. 1a and FIG. 1b, will be referred to as a "type one" QHC, and that of FIGS. 8a and 8b a "type two" QHC. The type two QHC differs from the type one QHC in that instead of a phase shift of +90° being introduced in the coupled path, a phase shift in the opposite sense, namely −90°, is introduced instead.

The explanation of the isolation which can be achieved for a 2×2 MPA using a type one QHC applies equally to a 2×2 MPA using type two QHCs, since the inversion has the same effect of cancelling the null signals, irrespective of the sense of the phase shift in the coupled paths.

Figure 9:
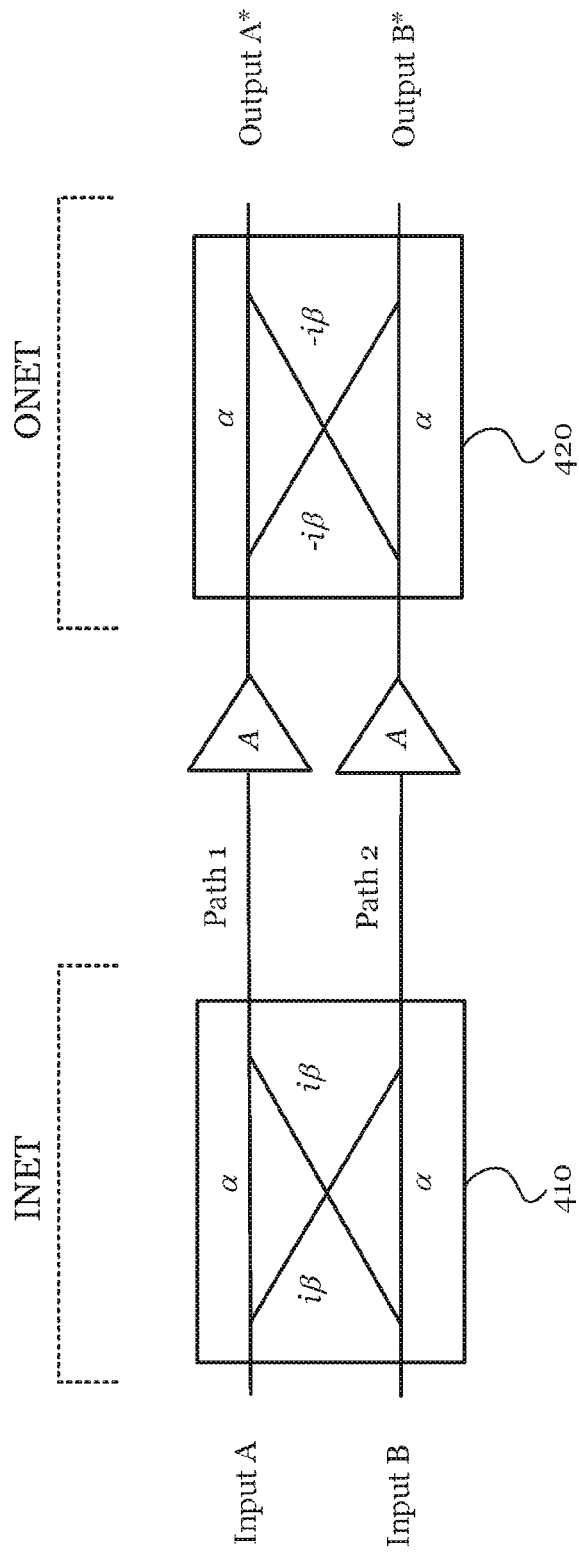
FIG. 9 shows a 2×2 MPA according to an embodiment of the present invention using QHCs of different types.

There is a particular effect, however, where different types of QHC are used in different ranks in the INET and ONET, as will be illustrated with reference to FIG. 9. FIG. 9 shows a 2×2 MPA in which the INET QHC 410 is of type one, and the ONET QHC 420 is of type two. The two QHCs are constructed such that $e_1=e_2$, where e is the imbalance of the QHCs (represented by the quantity $\alpha^2-\beta^2$ as described above) for all frequencies, in other words, the performance of the two QHCs is matched as described in the earlier embodiments. The 2×2 MPA has inputs A and B, outputs A* and B*, and two amplifiers of gain A. Unlike the previous embodiments, there is no signal inversion in the signal paths.

The wanted path is from input A to output A*, where the input and output are in phase. This has a total gain of $\alpha.A.\alpha+(i\beta).A.(-i\beta)=A(\alpha^2+\beta^2)=A$ on the assumption of axiom (6). The same applies to the wanted path from input B to output B*, by symmetry.

The null paths are from input A to output B* and from output B to input A*. Each has a total gain of $\alpha.A.(-i\beta)+(i\beta).A.\alpha=0$.

Therefore, the isolation is theoretically perfect for an amplifier of this design. Mathematically, the same result can be shown if the types of QHC in the INET and ONET were to be reversed, so that the INET QHC 410 is of type two, and the ONET QHC 420 is of type one.

For higher order MPAs, such as a 4×4 MPA, the use of different types of QHC in the INET and ONET can also be shown to apply to QHC of the same rank.

Figure 10:
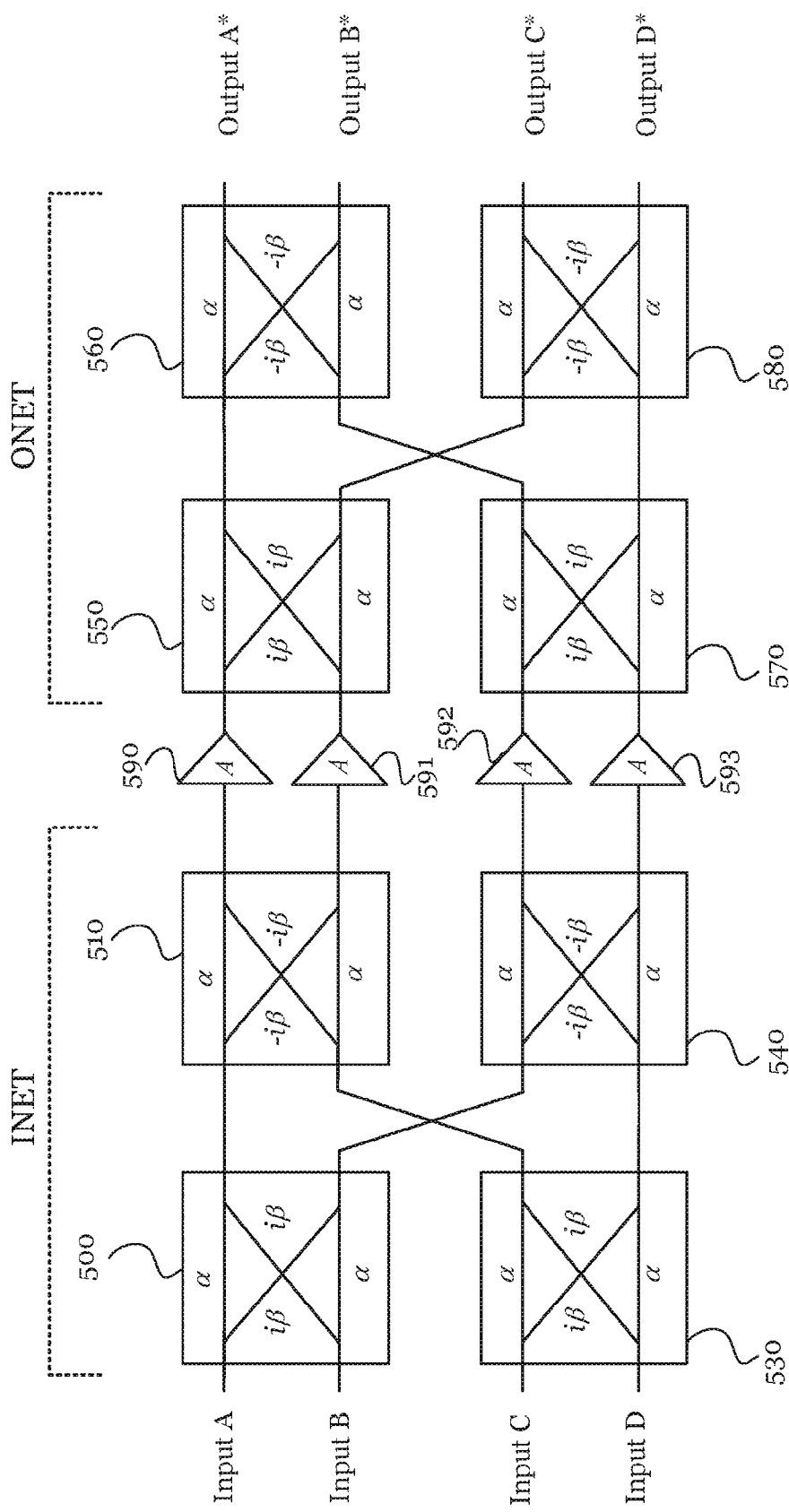
FIG. 10 shows a 4×4 MPA according to an embodiment of the present invention using QHCs of different types.

FIG. 10 illustrates a 4×4 MPA in which the QHCs 500, 530 of rank two in the INET and the QHCs 550, 570 of rank one in the ONET are of type one, while the QHCs 510, 540 of rank one in the INET and the QHCs 560, 580 of rank two in the ONET are of type two. Four amplifier paths are present through amplifiers 590, 591, 592 and 593.

A wanted path from input A to output A* has a gain of: $\alpha^4 A+\alpha.(-i\beta).A.(i\beta).\alpha+(i\beta).\alpha.A.\alpha.(-i\beta)+(i\beta).(-i\beta).A.(i\beta).(-i\beta)=(\alpha^4+2\alpha^2\beta^2+\beta^4)A=(\alpha^2+\beta^2)^2 A=A$ on the assumption of axiom (6).

A null path from input A to output B* has a gain of: $\alpha^8.A.(-i\beta)+\alpha.(-i\beta).A.(i\beta).(-i\beta)+(i\beta).\alpha.A.\alpha^2+(i\beta).(-i\beta).A.(i\beta).\alpha=(-\alpha^3 i\beta-i\beta^3\alpha+i\beta\alpha^8+i\beta^3\alpha)A=0$, and the same can be shown for all other null paths. Accordingly the theoretical isolation is perfect.

Larger MPAs can be derived accordingly, through mathematical induction, in the same way as described above, with respect to MPAs of size M×M, for $M=2^L$.

In more general terms, an improvement in isolation is also available where the MPA is of order N×N, where N=2L, for integer L. In other words, the number of amplifiers in the MPA does not need to need to be a power of two.

Figure 11:
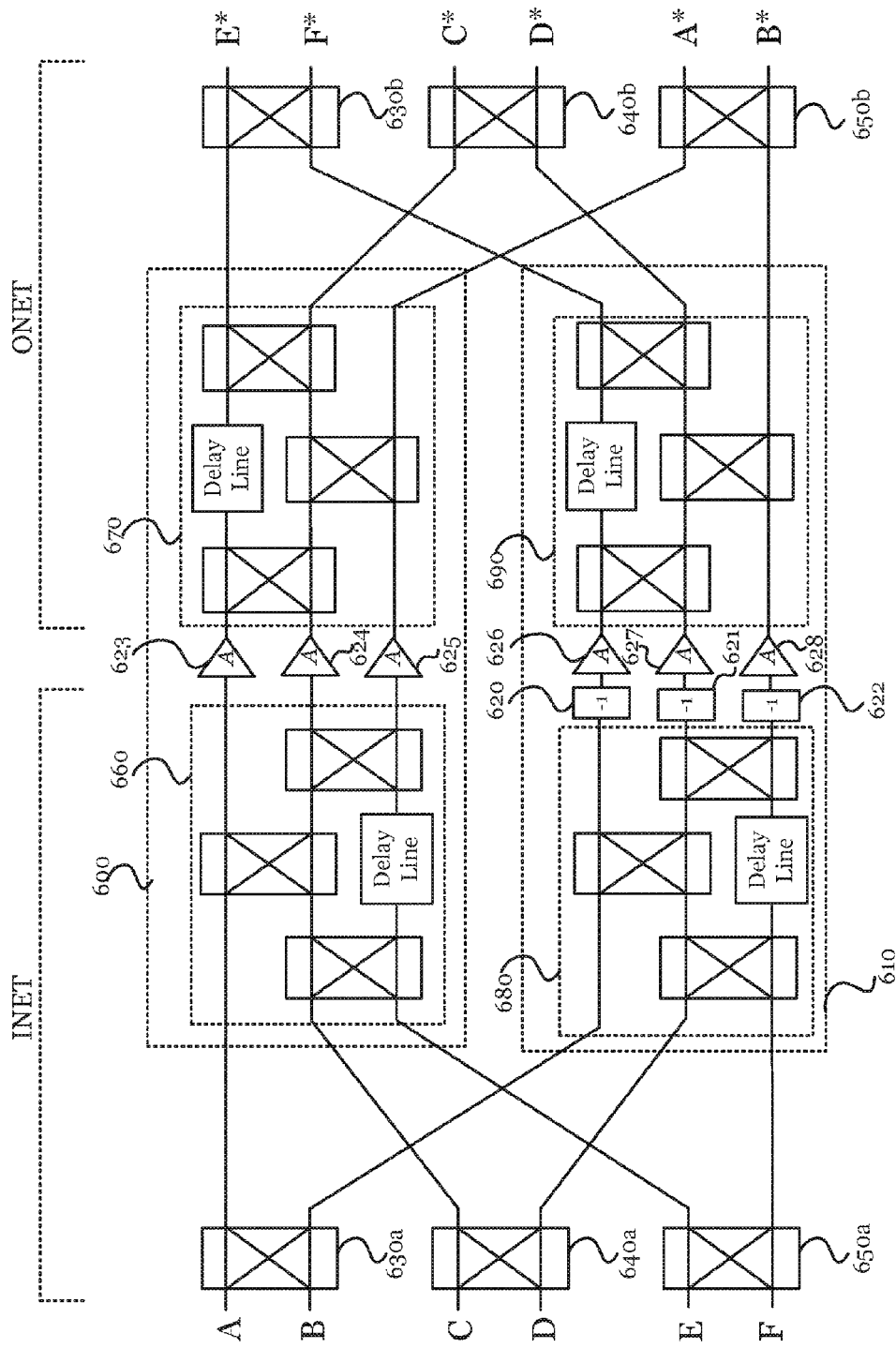
FIG. 11 shows a 6×6 MPA according to an embodiment of the present invention.

FIG. 11 shows a 6×6 MPA according to an embodiment of the present invention. For lo simplicity, all QHCs are of the same type.

The 6×6 MPA is synthesised from two 3×3 MPAs 600, 610, where inversions 620, 621, 622 are placed in the amplifier paths of the second 3×3 MPA 610, and additional QHCs.

For the general case of an N×N MPA of any integer value of N, the architecture of the MPA according to embodiments of the invention is derived as follows. The first stage is to find the prime factors of N, and construct the INET and ONET as two identical Butler matrices. Suppose one prime factor is P. The Butler matrix can be constructed as a rank of P Butler matrices of size P×P combined with a rank of N/P Butler matrices of size (N/P)×(N/P). The Butler matrices of size (N/P)×(N/P) can then be synthesized from smaller Butler matrices by dividing by the next prime factor and repeating the process.

Taking the case of 6×6, both INET and ONET will consist of a rank of three 2×2 Butler Matrices (i.e. QHCs) 630a, 640a, 650a, 630b, 640b, 650b followed by a rank of two $_3\times_3$ Butler matrices 660, 680, 670, 690. The 3×3 Butler matrices can in turn be synthesized from two balanced QHCs, one unbalanced QHC and a 90° phase shift, as explained below with reference to FIG. 12. The 6×6 MPA would thus use in total 14 balanced QHCs, 4 unbalanced QHCs and 4 phase shifting devices. This corresponds to two 3×3 MPAs with the addition of six QHCs.

Figure 12:
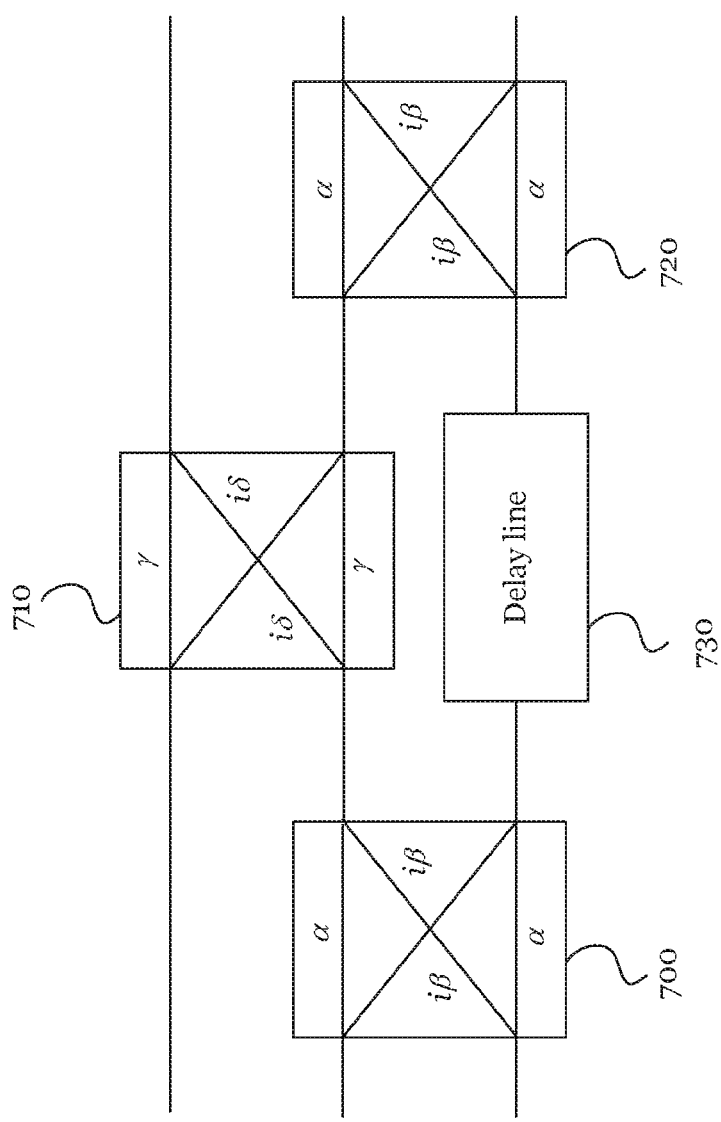
FIG. 12 shows a 3×3 Butler matrix used in the 6×6 MPA of FIG. 11.

For the 6×6 MPA shown in FIG. 11, a 3×3 Butler matrix 660 is shown in more detail in FIG. 12. The two balanced QHCs are shown as the outermost two couplers 700, 720, in which $\alpha^2=\beta^2=\frac{1}{2}$ in ideal circumstances. The unbalanced QHC 710 is shown as the centre coupler, in which direct gain $\gamma^2=\frac{1}{3}$, and coupled gain $\delta^2=\frac{2}{3}$ in ideal circumstances. In the amplifier path which does not contain the unbalanced QHC 710, a delay line 730 is introduced, having a phase shift $\varphi=90°$ and delay $\tau$, to compensate for the imbalance in the number of QHCs in each of the amplifier paths. When used in an MPA, deviations from these ideal values impair the null path isolation.

A 3×3 MPA 600 is constructed from two 3×3 Butler matrices 660, 670 and three amplifiers, one of the Butler matrices 670 "inverted" with respect to the other 660 in terms of the respective amplifier paths of the balanced and unbalanced QHCs. In the lowermost 3×3 MPA of FIG. 11, signal inversions are introduced prior to the amplifiers. In combination, the Butler matrices of the two 3×3 MPAs 600, 610 represent the innermost rank of the 6×6 MPA, the 6×6 MPA completed by the outermost rank of three balanced QHCs 630a, 640a, 650a, 630b, 640b, 650b in each of the INET and ONET.

The wanted paths of the 6×6 MPAs are A to A*, B to B*, C to C*, D to D*, E to E* and F to F*. There are six signal paths connecting A and A*, which each have a total gain represented by entirely real terms, in other words, with no phase shift component.

For the path from input A to output A*, the coupling gain is as follows, the terms shown in the order of the amplifiers 623, 624, 625, 626, 627, 628 from top to bottom of FIG. 11:

$\alpha.\gamma.A.(i\beta).(i\delta).\alpha+\alpha.(i\delta).\alpha.A.\alpha.(i\delta).\alpha+\alpha.(i\delta).(i\beta).A.\gamma.$ $\alpha-(i\beta).\gamma.A.(i\beta).(i\delta).(i\beta)-(i\beta).(i\delta).\alpha.A.\alpha.(i\delta).(i\beta)-(i\beta).$ $(i\delta).(i\beta).A.\gamma.(i\beta)=-A[\alpha^2\beta\gamma\delta+\alpha^4\delta^2+\alpha^2\beta\gamma\delta+\beta^3\gamma\delta+\alpha^2\beta^2\delta^2+\beta^3\gamma\delta].$ For the path from input A to output B*, the coupling gain is as follows, the terms again shown in the order of the amplifiers 623, 624, 625, 626, 627, 628 from the top to bottom of FIG. 11:

$\alpha.\gamma.A.(i\beta).(i\delta).(i\beta)+\alpha.(i\delta).\alpha.A.\alpha.(i\delta).(i\beta)+\alpha.(i\delta).(i\beta).A.\gamma.$ $(i\beta)-(i\beta).\gamma.A.(i\beta).(i\delta).\alpha-(i\beta).(i\delta).\alpha.A.\alpha.(i\delta).\alpha-(i\beta).(i\delta).$ $(i\beta).A.\gamma.\alpha=-iA[\alpha\beta^2\gamma\delta+\alpha^8\beta\delta^2+\alpha\beta^2\gamma\delta-\alpha\beta^2\gamma\delta-\alpha^8\beta\delta^2-\alpha\beta^2\gamma\delta]=0$, thus demonstrating the perfect isolation theoretically possible between a wanted path and a null path.

However, finite isolations due to imperfect null paths inherent in the individual 3×3 MPAs will still exist, since the 3×3 MPA component does not within itself demonstrate the isolation of the present invention. The result is that while perfect isolation is possible in one signal path, it is not possible in all signal paths, whereas this would be the case if the MPA were of order M×M for M=$2^L$. In the example of FIG. 11, for example, perfect isolation between the wanted path A→A* and the null path A→E* is not possible. Perfect isolation is theoretically possible between wanted path A→A* and null path A→B*, however, because the paths through the 3×3 MPAs 600, 610 are the same in both cases, and so any imperfections can be cancelled, the only difference in the signal paths occurring in the final coupler.

The technique employed in the MPAs of FIGS. 9 and 10, in which QHCs of different types are employed in the same respective rank of an INET and an ONET can also be shown to be valid in N×N MPAs for N=2L.

The analysis presented above with respect to FIG. 3 for a 2×2 MPA with imperfect phase can be extended by the same arguments as presented for the amplitude imbalance case to all the other scenarios illustrated in the previous embodiments. It thus applies to embodiments in which:

theoretically infinite isolation is possible in all null paths of a N×N MPA designed according to the invention where N is a power of 2, theoretically infinite isolation is possible in the null paths of a N×N MPA where the inversion is achieved by having the input coupler of a different type to that of the output in a respective INET/ONET rank, where N is a power of 2, and theoretically infinite isolation is possible for some null paths of a N×N MPA designed according to any embodiment of the invention where N is divisible by 2.

In the embodiments described above, the signal inverters are shown in the amplifier paths before the amplifier. It would also be possible, however, to arrange the inverters so that they are positioned after the amplifiers, in other words, between the amplifiers and the ONET, rather than between the INET and the amplifier. It can be seen that mathematically, there is no effect on the isolation through using the different inverter positions, and so it would also be possible to combine different inverter positions in each amplifier path.

In the embodiments described above, equivalent ranks of QHCs in the INET and ONET have been described as being equidistant from the internal amplifiers, based on assumption (5). This is for ease of explanation. With due care to the way connections are achieved, equivalent ranks can defined differently, so that they exist in different positions to those described. For example, equivalent ranks can be defined with respect to distance from the input to an INET or ONET, rather than with respect to distance from the internal amplifiers. Such changes do not affect the isolation achieved by the invention, but simply change the mapping from input to output of the wanted paths.

The MPAs of embodiments of the present invention may be located onboard communications satellites, the MPAs used to provide antenna feeds forming downlink communication channels from the satellite. Through improving the isolation performance, the downlink flexibility would be enhanced, in other words, the use of different channels through the MPA would be made simpler due to the improvement in the isolation between the wanted paths and the null paths. The improvement in bandwidth, over which such isolation can be achieved, significantly enhances the benefits of using an MPA. As set out above, the MPAs may also be used to amplify signals at any frequency or wavelength, not just those used in communication satellites, and may be used as acoustic or optical amplifiers.

In addition to the use in signal amplification, the arrangements of the invention could be used in a test bridge circuit to compare the coupling factors of directional couplers. Given a set of known QHCs, for example, a test QHC could be incorporated into an MPA according to an embodiment of the invention, in order to test whether the isolation performance is as expected, or whether the imbalance between quantities $\alpha$ and $\beta$ is such that significant bandwidth limitations would be present when using the test coupler in an MPA. The test performance of the coupler need be related specifically to its use in an MPA, however, and the test results may simply provide an estimation of performance in more general terms, such as comparison with a 3 dB coupling threshold.

The skilled person will appreciate that a number of physical modifications to the embodiments described above will be possible which fall within the scope of the claims, to the extent that the maximum theoretical isolation between a wanted path and a null path is zero. For example, differences in structure of the inverters may be possible, such that phase inversion is achieved, while the physical structure of the QHC may take a number of forms. Various combinations of the QHC types are also possible, within the teaching of the embodiments described above, and the position of the inverters within the amplifier paths can vary in accordance with the particular coupling coefficients of the QHCs used, in terms to the phase change introduced by the couplers when coupling between different signal paths.

In the embodiments described above, the amplifier paths of all MPAs have to be aligned in insertion gain, insertion phase and group delay (equivalent to rate of change of phase with frequency) in order for the null path isolation to be achieved.

This is done at beginning of life during integration of the MPA by the inclusion of fixed attenuators in the amplifier paths to correct for the fixed differences in gain, and by manually adjusted line stretchers which correct for fixed group delay and phase differences between the amplifier paths.

The setting of these components is achieved by making appropriate adjustments whilst monitoring a null path so as to maximise the null path isolation.

In operation, calibration of the amplifiers may also be required to correct for the life time variations of the internal amplifier paths. This would be achieved in a similar manner by installing telecommandable gain adjusters and phase adjusters in the amplifier paths. During operation, calibration would be achieved by adjusting these components whilst similarly monitoring a null path so as to maximise the null path isolation.

The advantages of embodiments of the invention will be illustrated by comparison with the effect of phase and gain adjustment to enable internal amplifier path alignment in a conventional 2×2 MPA as shown in FIG. 2, in which a gain/phase adjuster is arranged before the amplifier in the first signal path to apply gain correction x and phase adjustment $\theta$. Assume that the direct gain is $\alpha$, and the coupled gain is $\beta$ flat a phase of $\pi/2+\varphi$.

Assume that the gain correction x is initially set to unity and the phase correction $\theta$ to zero. Assume also that the calibrator chooses to apply an input signal to input A and monitor for a null at output B*. The gain from A to B* via path 1 is $\alpha.x.A.\alpha$ at a phase angle $\theta$, whilst the gain via path 2 is $\beta.A.\beta$ at a phase angle $\pi+2\varphi$. The calibrator thus finds that he must set $x=\beta^2/\alpha^2$ and $\theta=2\varphi$ order to make the two paths equal and opposite, and thus get a null at output B*.

However, had the calibrator applied a signal at input B and monitored at output A* he would have come to the conclusion that he would have had to set $x=\alpha^2/\beta^2$ and $\theta=-2\varphi$ in order to get a null at output A*.

Thus in order to get a good calibration, the calibrator must perform the calibration both ways, taking the geometric mean of the two gain corrections and the arithmetic mean of the two phase corrections, obtaining $x=(\beta/\alpha).(\alpha/\beta)=1$ and $\theta=(2\varphi-2\varphi)/2=0$, the best compromise attainable.

For a larger M×M MPA (where M is a power of 2), it will be seen that in order to obtain a good calibration, the calibrator must try many null paths and average the results in order to get a good calibration, or risk having a systematically biased calibration. As M grows larger, this becomes an onerous task.

Now consider the same scenario, but with the 2×2 MPA designed according to the embodiment of FIG. 3, with gain and phase adjustment as described above, applied in the first amplifier path.

As before assume the calibrator chooses to apply an input signal to input A and monitor for a null at output B*. The gain from A to B* via path 1 is $\alpha.x.A.\beta$ at a phase angle: $\theta+\pi/2+\varphi$, whilst the gain via path 2 is $-\beta.A.\alpha$ at a phase angle $\pi/2+\varphi$.

The calibrator thus finds that he must set x=1 and $\theta=0$ in order to make the two paths equal and opposite, and thus get a null at output B*. Had the calibrator applied a signal at input B and monitored at output A* he would have come to the same conclusion that he would have had to set x=1 and $\theta=0$ in order to get a null at output A*.

Thus the calibrator now knows that for this design of MPA he only needs to do the calibration from one input, as applying the signal to either input gives the same result.

Now consider calibrating a M×M MPA (where M is a power of 2). It will be seen that all inputs give the same calibration results, thus the whole calibration can be performed using just one input without introducing a systematic error. Random errors due to the manufacturing tolerances of the INET and ONET will remain, but these are of less significance.

The invention claimed is:

1. An N×N multiport amplifier (MPA), comprising an N-input input network, INET, an N-output output network, ONET, and N amplifiers interposed between the INET and the ONET, the MPA comprising N wanted signal paths and N.(N−1) null signal paths, wherein:
   N is divisible by 2;
   half of the N amplifier paths comprise a signal inversion, which does not introduce a signal delay, with respect to the other half of the N amplifier paths; and
   the INET and the ONET each comprise one or more quadrature hybrid couplers, QHC, the input of each QHC comprising a pair of signal paths, and the output of each QHC comprising a pair of signal paths;
   wherein a pair of amplifier paths is arranged between the output of a first QHC in the INET and the input of a second QHC at the ONET;
   and each signal inversion is arranged in one of the amplifier paths of each pair of amplifier paths such that the ideal amplitude gain of at least one of the N.(N−1) null signal paths is zero.

2. The MPA according to claim 1, wherein the INET and ONET have the same frequency response.

3. The MPA according to claim 1, wherein the one or more QHCs are formed of a broad wall and/or a narrow wall short slot hybrid junction.

4. The MPA according claim 1, further comprising means for compensating for phase and amplitude errors in the amplifier paths.

5. The MPA according to claim 1, wherein the amplifier paths comprise waveguides, and signal inversion is achieved by changing the sequence of E-plane and H-plane bends in the waveguide of one of the amplifier paths of each pair of amplifier paths relative to that in the other.

6. The MPA according to claim 1, wherein the amplifier paths comprise waveguides, and signal inversion is achieved by changing the chirality of a 90° degree twist in the waveguide of one of the amplifier paths of each pair of amplifier paths relative to that in the other.

7. The MPA according to claim 1, wherein the amplifier paths comprise waveguides, and signal inversion is achieved by replacing a straight waveguide in one of the amplifier paths of each pair of amplifier paths by a waveguide comprising a 180° twist.

8. The MPA according to claim 1, wherein the signal inversion is achieved by inverting a waveguide-to-coaxial transition in one of the amplifier paths of each pair of amplifier paths relative to that in the other.

9. The MPA according to claim 1, wherein the signal inversion is achieved by placing an inverting transformer in one of the amplifier paths of each pair of amplifier paths, and a non-inverting transformer in the other.

10. The MPA according to claim 1, wherein the signal inversion is achieved by placing an inverting amplifier in one of the amplifier paths of each pair of amplifier paths, and a non-inverting amplifier in the other.

11. The MPA according to claim 1, wherein the signal inversion is achieved by placing a first length of waveguide in one of the amplifier paths and a second length of waveguide in the other amplifier path with a different cross section from the first length of waveguide, the cross section such that a relative phase shift of 180° between the two amplifier paths is approximately obtained.

12. The MPA according to claim 1, wherein the signal inversion is arranged to be performed between the INET and the amplifier in the amplifier path.

13. The MPA according to claim 1, wherein the signal inversion is arranged to be performed between the amplifier and the ONET in the amplifier path.

14. The MPA according to claim 1, wherein $N=2^L$ for integer L, and the signal inversion is arranged such that the ideal gain of all of the N.(N−1) null signal paths is zero.

15. An MPA comprising an N-input input network, INET, an N-output output network, ONET, and N amplifiers interposed between the INET and the ONET, the MPA comprising N wanted signal paths and N.(N−1) null signal paths in which:

$N=2^L$ for integer L;

the INET and the ONET each comprise one or more quadrature hybrid couplers, QHC, the input of each QHC comprising a pair of signal paths, and the output of each QHC comprising a pair of signal paths; and a pair of amplifier paths is arranged between the output of a first QHC in the INET and the input of a second QHC in the ONET;

wherein the quadrature phase shift of the coupling of a QHC of a predetermined rank in the INET is in the opposite of the coupling of a QHC of the same predetermined rank in the ONET.

* * * * *